United States Patent
Shi et al.

[11] Patent Number: 6,013,383
[45] Date of Patent: Jan. 11, 2000

[54] ORGANIC ELECTROLUMINESCENCE DEVICE WITH IMPROVED HOLE TRANSPORTING MATERIAL

[75] Inventors: Song Shi, Phoenix; Cynthia Gorsuch, Tempe; Maridela C. Siethoff, Phoenix, all of Ariz.; H. C. Lee, Calabasas, Calif.

[73] Assignee: Motorola, Inc., Schaumburg, Ill.

[21] Appl. No.: 08/801,613

[22] Filed: Feb. 18, 1997

[51] Int. Cl.$^7$ .................................................. H05B 33/14
[52] U.S. Cl. .......................... 428/690; 428/691; 428/917; 313/506
[58] Field of Search .................... 428/690, 917, 428/691; 313/504–509

[56] References Cited

U.S. PATENT DOCUMENTS

| | | | |
|---|---|---|---|
| 4,233,384 | 11/1980 | Turner et al. | 430/59 |
| 4,539,507 | 9/1985 | VanSlyke et al. | 313/504 |
| 5,141,671 | 8/1992 | Bryan et al. | 252/301.16 |
| 5,150,006 | 9/1992 | VanSlyke et al. | 313/504 |
| 5,151,629 | 9/1992 | VanSlyke | 313/504 |
| 5,153,073 | 10/1992 | Ohnuma et al. | 428/461 |
| 5,256,945 | 10/1993 | Imai et al. | 313/504 |
| 5,443,921 | 8/1995 | Hosokawa et al. | 428/690 |
| 5,518,824 | 5/1996 | Funhoff et al. | 428/690 |
| 5,571,626 | 11/1996 | Cumming et al. | 428/457 |
| 5,683,842 | 11/1997 | Duff et al. | 430/59 |

OTHER PUBLICATIONS

Characteristics of doped Blue EL cells, Nakamura, et al; Technical Report of IEICE OME94–80 (1995–03).
Efficient Electroluminescence of Distyrylarylene with hole transporting ability, Hosokawa, et al; J. Appl. Phys. 78 Nov. 1, 1995, pp. 5831–5833.

*Primary Examiner*—Charles Nold
*Attorney, Agent, or Firm*—Eugene A. Parsons; William E. Koch

[57] ABSTRACT

An organic electroluminescent display device (10) includes a plurality of organic layers (16, 18, 20, 22 and 24) disposed between opposing electrodes (14 and 26). The hole transporting layer (22) comprises a hole transporting material characterized by the general formula:

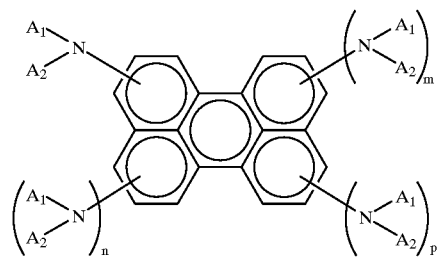

where n, m, and p each independently take the value of 0, 1 or 2; A1 and A2 each represents:

(a) an alkyl group; or
(b) an alkyl substituted with aryl, hydroxy, cyano, alkoxy, halo, or amino group(s); or
(c) an aryl group; or
(d) an aryl group substituted with alkyl, aryl, hydroxy, cyano, alkoxy, phenyl, halo, or amino group(s).

24 Claims, 1 Drawing Sheet

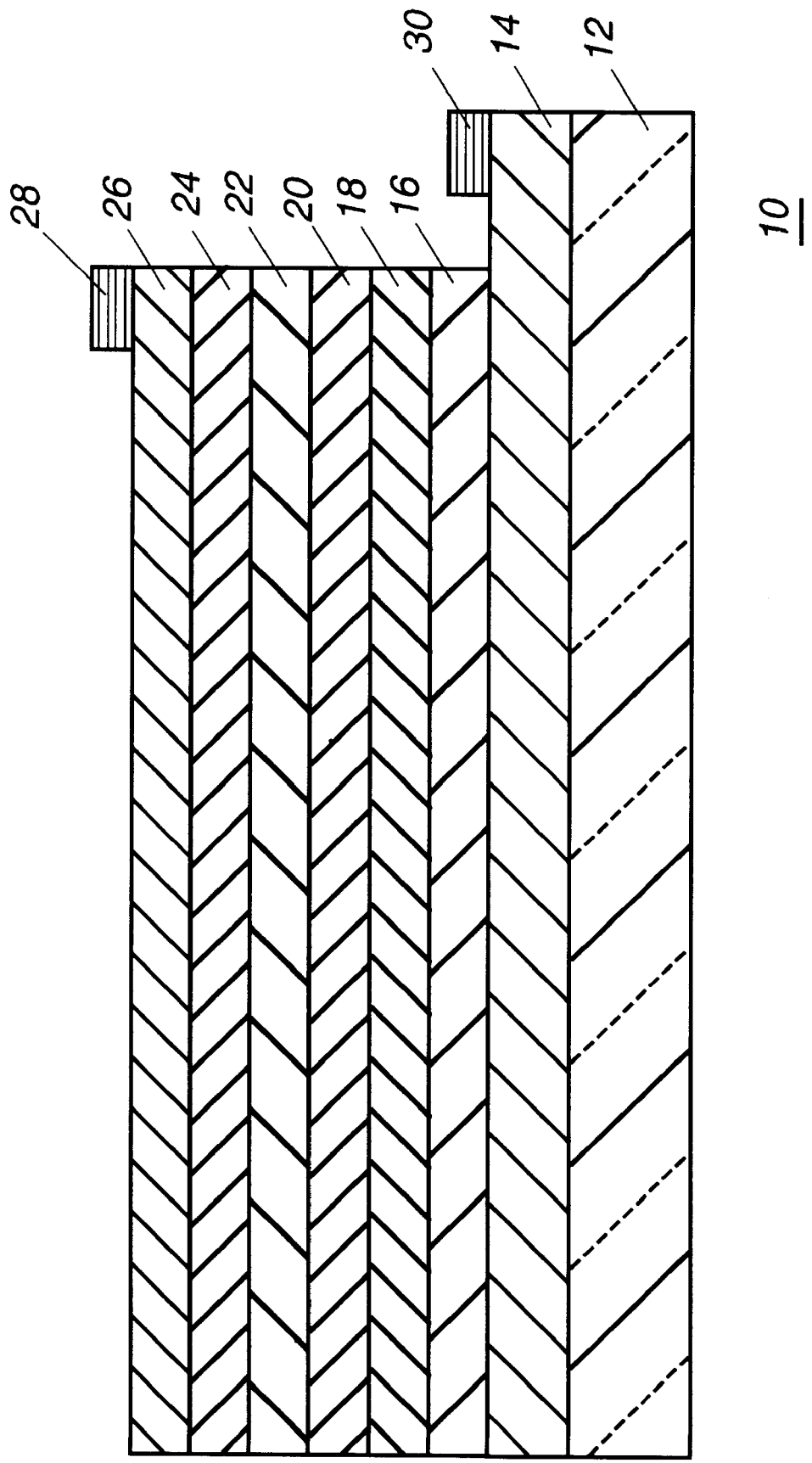

ORGANIC ELECTROLUMINESCENCE DEVICE WITH IMPROVED HOLE TRANSPORTING MATERIAL

TECHNICAL FIELD

This invention relates in general to flat panel information display devices and in particular to light emitting organic electroluminescent information display devices.

BACKGROUND OF THE INVENTION

Until fairly recently, the preferred, indeed the only means by which to display information in the electronic medium was to use a video monitor comprising a cathode ray tube ("CRT"). CRT technology has been well known for over 50 years, and has gained widespread commercial acceptance in applications ranging from desktop computer modules to home televisions and industrial applications. CRTs are essentially large vacuum tubes having one substantially planar surface upon which information is displayed. Coated on the inside surface of the CRT is a layer of phosphorous which respond by emitting light when struck by electrons emitted from the electron gun of the CRT. The electron gun is disposed in an elongated portion which extends away from the inside surface of the display surface of the CRT.

While CRTs are widely used in numerous applications, there are several inherent limitations to the application of CRT technology. For example, CRTs are relatively large and consume a great deal of energy. Moreover, as there are fabricated of glass, the larger they get the heavier they get. Given the need for the electron gun to be spacedly disposed from the phosphorous surface of the display surface, CRTs have a substantial depth dimension and width dimensions thereof. Accordingly, CRTs are absolutely of no value for a small and portable applications, such as Walkmen, laptop computers, and other increasingly portable electronic applications which require the use of displays.

To answer the needs of the marketplace for smaller, more portable display devices, manufacturers have created numerous types of flat panel display devices. Examples of flat panel display devices include active matrix liquid crystal displays, plasma displays, and electroluminescent displays. Each of these types of displays has use for a particular market application, though each are accompanied by various limitations which make them less than ideal for certain applications. Principal limitations inherent in devices such as AMLCDs relate to the fact that they are fabricated predominantly of inorganic semiconductor materials by semiconductor fabrication processes. These materials and processes are extremely expensive, and due to the complexity of the manufacturing process, cannot be reliably manufactured in high yields. Accordingly, the costs of these devices are very high with no promise of immediate cost reduction.

One preferred type of device which is currently receiving substantial research effort is the organic electroluminescent devices. Organic electroluminescent devices ("OED") are generally composed of a plurality of layers of organic molecules sandwiched between transparent, conductive and/or metallic conductive electrodes. There are typically three organic layers which include an electron transporting layer, an emissive layer, and a hole transporting layer. Charge carriers, i.e., electron and holes, inject from either the electron or hole transporting layers, and combine in the emissive layer. Electrons are negatively charged atomic particles and holes are the positively charged counterparts.

There are several variations in OED structures, depending upon where the emissive layer is positioned. Tsutsui, et al proposed three OED cell structures: SH-A, SH-B, and DH. (T. Tsutsui, et al, *Photochem. Processes Organ. Mol. Syst.*, Proc. Meml. Conf. Late Professor Shigeo Tazuke, 437–50 (1991)). SH-A cells are successively composed of a plurality of layers including Mg-Ag as a cathode electrode, an electron transporting layer (ETL), a hole transporting layer (HTL), and indium tin oxide or ITO as the anode electrode. The region of the ETL close to the HTL is doped with an efficient, thermally stable fluorescent dye to act as the emitter region or layer. An SH-B type cell likewise comprises a Mg—Ag as a cathode electrode, an ETL, an HTL, and ITO as the anode electrode. However, unlike the SH-A, the region of the HTL close to the ETL is doped with an efficient, thermally stable fluorescent dye to act as the emitter region or layer. Finally, the DH type of display again comprises Mg—Ag as a cathode electrode, an ETL, a HTL, and ITO as the anode electrode. The emitter region or layer in a DH cell is a discrete layer of an emitter material operatively disposed between the ETL and the HTL.

U.S. Pat. No. 4,539,507 to VanSlyke, et al, is among the first to disclose an SH-A type display with a hole injecting and luminescent zone. Subsequent patents to VanSlyke and others have disclosed devices and materials which are adapted to provide OEDs which lumenese in the blue to blue-green portions of the spectrum. In this regard, reference is made to, among others, U.S. Pat. Nos. 5,150,006, 5,141,671, 5,151,629, and 5,153,073.

Commonly assigned, co-pending U.S. patent application Ser. No. 08/660,014, filed Jun. 6, 1996, and entitled "ORGANIC ELECTROLUMINESCENCE DEVICE WITH EMISSION FROM HOLE TRANSPORTING LAYER", discloses an efficient SH-B type of OED, where, with proper selection of the ETL and HTL materials, efficient light emission is obtained from the HTL. To realize the disclosed structure, an efficient emissive hole transporting material, which can fluoresce well in the blue to green region of the spectrum, i.e., 450–550 nanometers (nm), is required.

Accordingly, there exists a need for emissive hole transporting materials for use as the hole transporting layer in OEDs. The material should be relatively inexpensive and easy to fabricate as well as being conducive to manufacturing in the current OED manufacturing process. The device should have good thermal stability, and be capable of operating at voltages which are within the range of those generally accepted for OEDs, and fluoresce will in the blue to blue-green region of the spectrum.

BRIEF DESCRIPTION OF THE DRAWINGS

FIG. 1 is a simplified cross-sectional side view of an organic electroluminescent device in accordance with the instant invention.

DETAILED DESCRIPTION OF THE PREFERRED EMBODIMENT

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, there is illustrated therein an organic electroluminescent device as is well known in the art. The device 10 contains, as a rule, one or more layers of organic charge transport materials. The device 10 is fabricated upon a first substrate 12 which is transparent and may be fabricated of any of the number of known materials employed in the art. For example, the substrate 12 may be fabricated of a glass, such as a Corning 7059 glass, transparent plastic substrates made of polyolefins, polyethersulfones, polyarylates. In one preferred embodiment, the substrate 12 is fabricated of glass of quality good for flat panel display applications.

Deposited atop substrate 12 is a first electrode 14, which is electrically conductive and optically transparent or semi-transparent. Several materials may be advantageously employed as the first electrode for an OED device. Examples of materials include conductive metal oxides such as indium oxide, indium-tin oxide (ITO), zinc oxide, zinc-tin oxide, and conductive transparent polymers such as polyaniline. Alternatively, the electrode 14 may be fabricated of a semi-transparent metal, examples of which include a thin layer (<500 Å) of gold, copper, silver, and combinations thereof. In one preferred embodiment, the electrode 14 is fabricated of ITO or zinc oxide.

Thereafter, a first layer of an organic material is deposited atop the first electrode 14. The first layer 16 is an organic material adapted to accept holes from the first electrode 14, the hole being for subsequent combinations with electrons in the emitter layer described herein below. The layer 16 is known as the hole injecting layer that also act as a buffer layer to match the thermal and mechanical properties of the first electrode and the subsequent layers of organic materials. The hole injection layer is preferably comprised of a porphyrinic compound of the type disclosed by Adler in U.S. Pat. No. 3,935,031 or Tang in U.S. Pat. No. 4,356,429. Examples of the preferred compounds include copper phthalocyanine, and zinc phthalocyanine. Alternative hole injecting materials such as carbon films can also be used. It is to be understood that the hole injecting layer is optional, and need not necessarily be provided.

Thereafter deposited atop the hole injecting layer 16 is a hole transporting layer 18. The purpose of the hole transporting layer is to facilitate the transport of holes from the hole injecting layer 16 (if present) to the emitter region or layer 20 (depending on the type of OED structure), where they are combined with the electrons to create photons for the emission of light. The hole transporting layer 18 will be described in greater detail herein below.

Thereafter deposited atop the hole transporting layer 18 is a layer of emitter 20. The emitter layer 20 is typically comprised of a host emitting matrix and a guest emitter. The host emitting matrix is fabricated of an organic material adapted to accommodate both holes and electrons and then transfer the excited state energies to the guest emitter, wherein the holes and electrons combine and emit a photon of light causing a visible change in the appearance of the OED device to a viewer thereof.

In SH-A type OEDs, the materials that can be used as the host emitting matrix include metal chelated oxinoid compounds disclosed in U.S. Pat. Nos. 4,769,292, 5,529,853, 5,151,629, and 5,150,006, or alternatively, for example, organometallic complexes disclosed in a pending U.S. Patent Application entitled "NEW ORGANOMETALLIC COMPLEXES FOR USE IN LIGHT EMITTING DEVICES", filed Sep. 12, 1994, bearing Ser. No. 08/304,451, and assigned to the same assignee. Examples of the preferred host emitting matrix materials are selected from tris(8-quinolinol) aluminum, bis(10-oxo-benzo[h] quinoline) beryllium, bis(2-(2-oxy-phenyl)benzoxazole) zinc, bis(2-(2-oxy-phenyl)benzothiazole) zinc, bis(2-methyl-8O-quinolinolato) aluminum-oxo-bis(2-methyl-8O-quinolinolato) aluminum, and bix(2-methyl-8O-quinolinolato)((ortho-cresolate) aluminum, to name a few.

In SH-B type OEDs, the materials that can be used as the host emitting matrix include emissive hole transporting materials made of organic aromatic amine compounds. Examples of the preferred host emitting matrix materials are one of the subjects of the present invention and will be described in greater detail herein below.

The materials that can be used as a guest emitter include dyes and pigments of high fluorescent efficiency. For efficient energy transfer, it is necessary that the guest emitter material have a bandgap no greater than that of the material making up the emitting host matrix. It is preferred that the guest emitter material is present in a concentration of from $10^{-3}$ to 10 mole percent, based on the moles of the material comprised of the emitting host matrix. The selection of the guest emitting materials is well known to those skilled in the art.

Thereafter deposited atop the emitter layer 20 is an electron transporting layer 22 fabricated of a material selected from the group of materials disclosed in, for example, U.S. Pat. No. 4,769,292 and U.S. Pat. No. 5,529,853, and in the aforementioned Ser. No. 08/304,451 patent application. The electron transporting layer, like the hole transporting layer 18, is adapted to gather charge carriers, in this case electrons, generated in an electron injecting layer for transport to the emitter layer where they are combined with holes as described hereinabove. In this regard, characteristics of an appropriate electron transporting layer include tris(8-quinolinol) aluminum, bis(10-oxo-benzo[h] quinoline beryllium, bis(2-(2 -oxy-phenyl)benzoxazole) zinc, bis(2-(2-oxy-phenyl)benzothiazole) zinc, and combinations thereof.

Thereafter deposited atop the electron transporting layer is an electron injecting layer 24. The electron injecting layer 24 like the hole injecting layer 14 is adapted to accept charge carriers, in this case electrons, and is entirely optional. In general, the electron injection layer 24 may be omitted without significantly compromising device performance.

Deposited atop the electron injecting layer is a second electrode 26 which is typically formed of a metal of work function of less than 4 electron volts (eV) and at least one other protective metal of higher work function. The preferred low work function metal is selected from a group of lithium, magnesium, calcium, and strontium, while the preferred high work function metal is selected from a group of aluminum, indium, copper, gold, and silver. Alternatively, the second electrode is formed of an alloy of a lower work function metal and a high work function metal by co-evaporation. The content of the low work function metal in the second electrode can vary from 0.1% to 50%, but preferably below 20%.

In operation, holes inject from the first electrode (also called the anode) and electrons inject from the second electrode (also called the cathode) into the organic layers disposed between the electrically conductive electrodes 14 and 26, when an electrical current is applied between the anode and cathode. An electrical current may be applied by connecting the electrodes to electrical current generation means (not shown) at electrical contacts 28 and 30 on electrodes 26 and 14 respectively. Electrical contacts may be fabricated of any type of electrically conductive material which is mechanically compatible with the electrode materials.

The instant invention is directed to a novel hole transporting aterial which may be used in the hole transporting layer 22 of the instant nvention. The hole transporting material is adapted to fluoresce in the lue to green region of the electromagnetic spectrum, i.e. in the range of about 450–550 nm. The hole transporting material has the general formula:

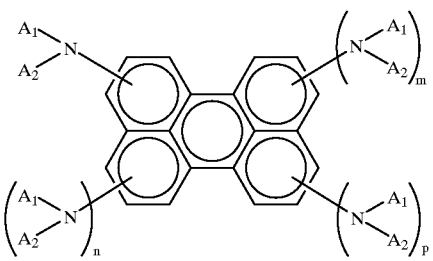

Where n, m, and p, each independently equal 0, 1 or 2; and A1 and A2 each represents:

(a) an alkyl group; or
(b) an alkyl substituted with aryl, hydroxy, cyano, alkoxy, halo, amino group(s); or
(c) an aryl group; or
(d) an aryl group substituted with alkyl, aryl, hydroxy, cyano, alkoxy, phenyl, halo, or amino group(s).

A preferred embodiment of the above general formula is one in which A1 and A2 are selected from phenyls, naphthyls, their derivatives, and combinations thereof. As a result, preferred materials can be characterized by materials having the following formulas:

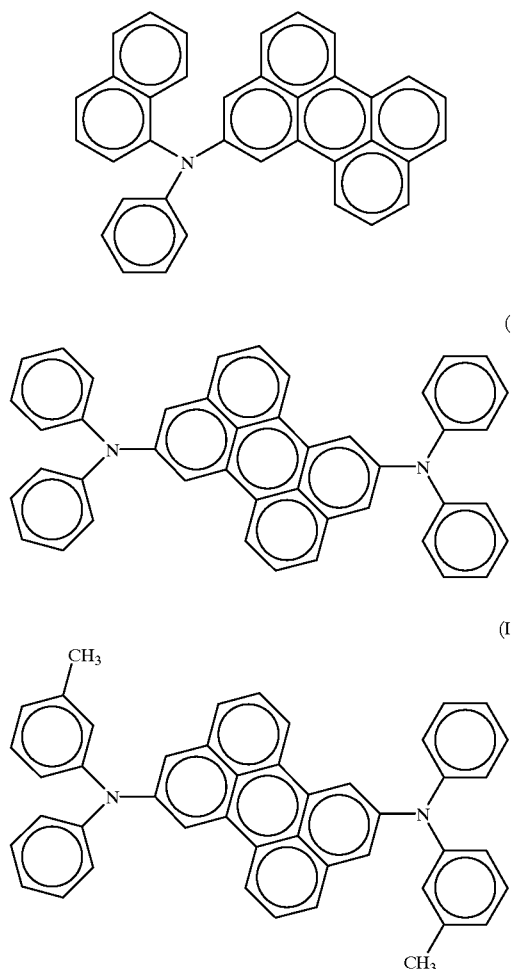

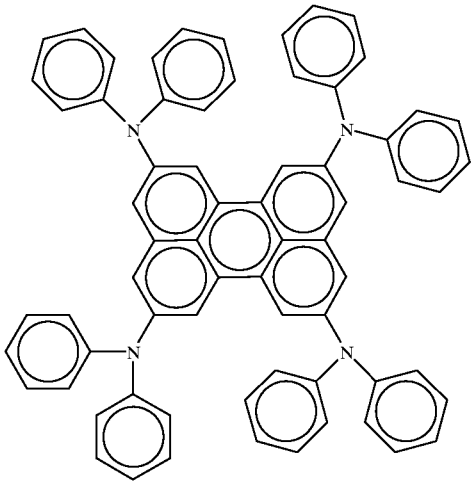

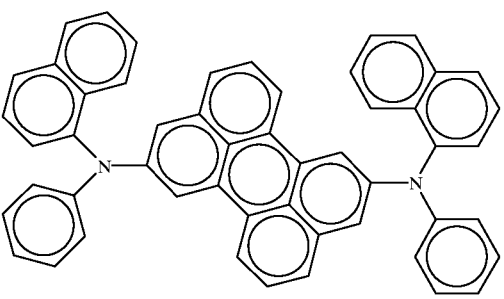

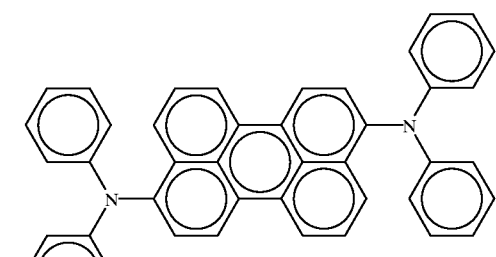

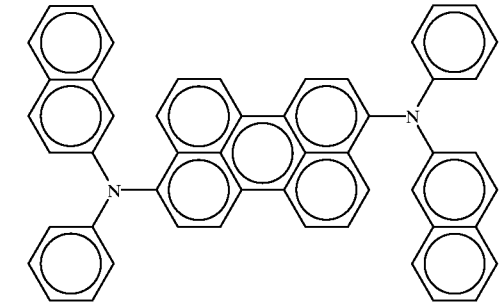

The present invention is particularly useful in SH-B type OEDs, where an efficient emissive hole transporting material, which can fluoresce well in the blue to green region of the spectrum, i.e., 450–550 nanometers (nm), is needed. In SH-B type OEDs, the disclosed materials not only can be used as a hole transporting layer 22, but can also be used as the host emitting matrix in the emitting layer 20 of the instant invention.

In SH-A type OEDs, besides acting as the hole transporting layer 22, the materials can also be used, independently, as a guest emitter in layer 20, since the materials are organic dyes of high fluorescent efficiency and good thermal stability. It is preferred that as a guest emitter, the disclosed materials be present in a concentration of from $10^{-3}$ to 10 mole percent, based on the moles of the material comprised of the emitting host matrix.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A hole transporting material for use in an electroluminescent display device comprising a material having the general formula:

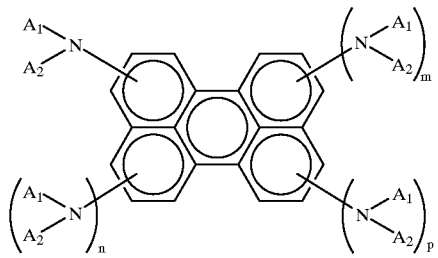

where n, m, and p each independently, equal 0, 1, or 2; and A1 and A2 are selected from the group consisting of an alkyl group an alkyl group substituted with aryl, hydroxy, cyano, alkoxy, halo, aryl groups, and an aryl group substituted with alkyl, aryl, hydroxy, cyano, alkoxy, phenyl, halo, amino groups.

2. A hole transporting material as in claim 1, wherein said hole transporting material has the formula:

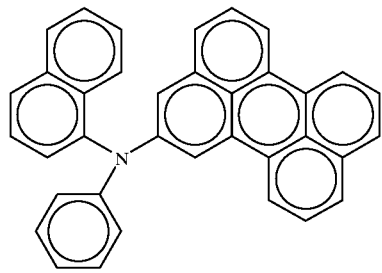

3. A hole transporting material as in claim 1, wherein said hole transporting material has the formula:

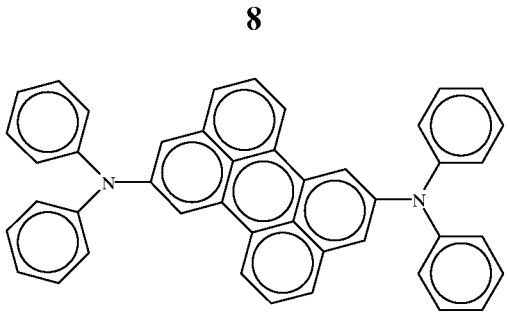

4. A hole transporting material as in claim 1, wherein said hole transporting material has the formula:

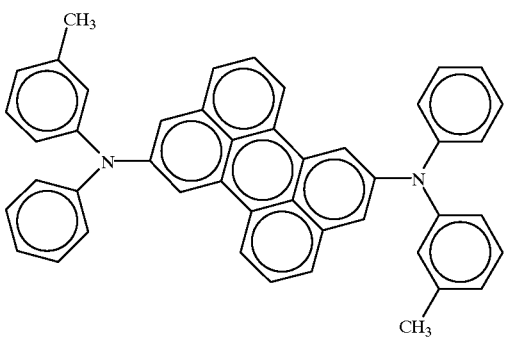

5. A hole transporting material as in claim 1, wherein said hole transporting material has the formula:

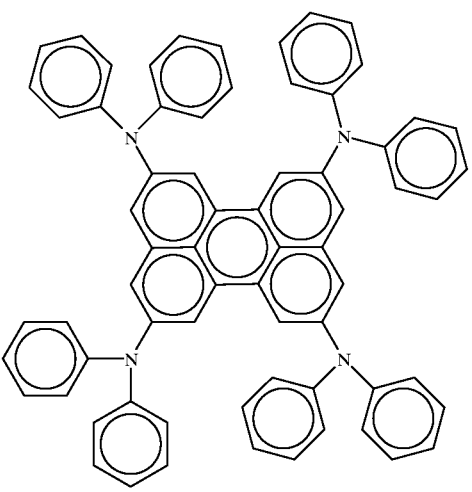

6. A hole transporting material as in claim 1, wherein said hole transporting material has the formula:

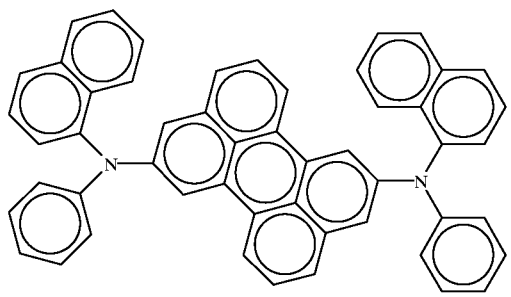

7. A hole transporting material as in claim 1, wherein said hole tansporting material has the formula:

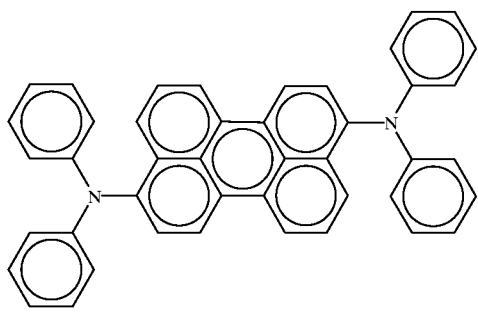

8. A hole transporting material as in claim 1, wherein said hole transporting material has the formula:

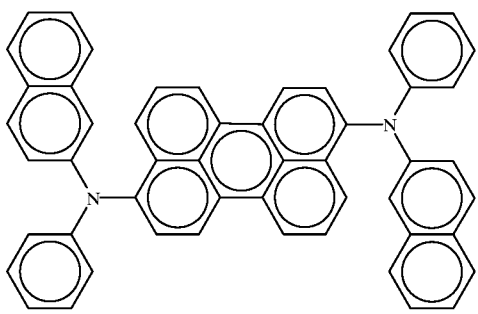

9. An organic electroluminescent display device comprising a plurality of layers of organic molecules disposed between a pair of electrodes, at least one of said layers comprising organic molecules having the general formula:

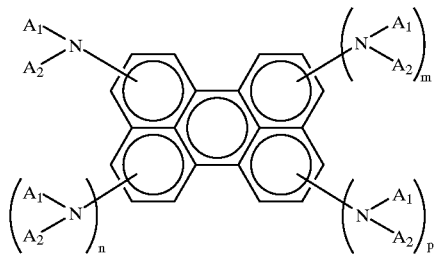

where n, m, and p each independently equal 0, 1, or 2; and A1 and A1 are selected from the group consisting of an alkyl group, an alkyl group substituted with aryl, hydroxy, cyano, alkoxy, halo, aryl groups, and an aryl group substituted with alkyl, aryl, hydroxy, cyano, alkoxy, phenyl, halo, amino groups.

10. An organic electroluminescent display device as in claim 9, wherein said organic molecules have the formula:

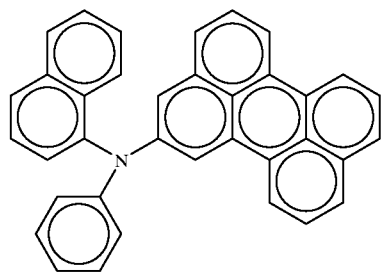

11. An organic electroluminescent display device as in claim 9, wherein said organic molecules have the formula:

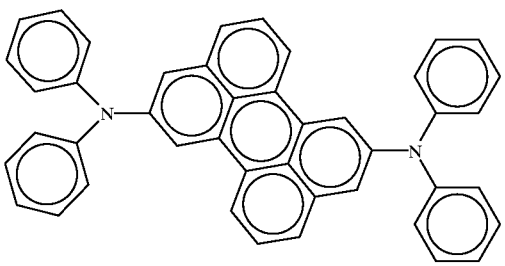

12. An organic electroluminescent display device as in claim 9, wherein said organic molecules have the formula:

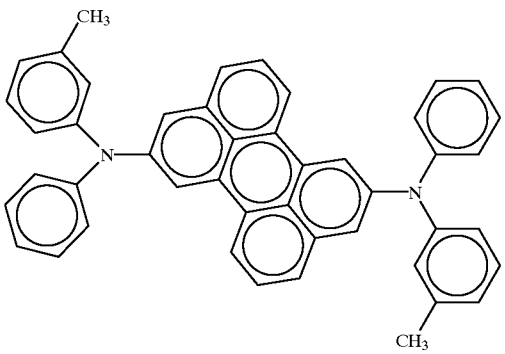

13. An organic electroluminescent display device as in claim 9, wherein said organic molecules have the formula:

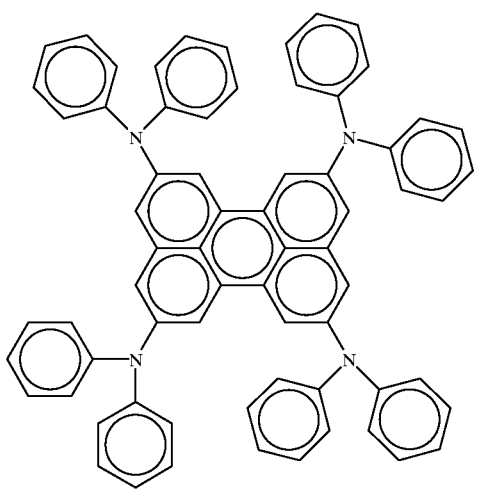

14. An organic electroluminescent display device as in claim 9, wherein said organic molecules have the formula:

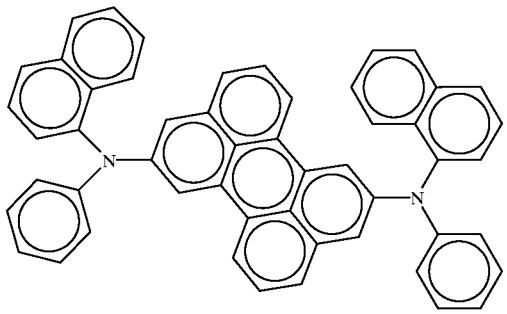

15. An organic electroluminescent display device as in claim 9, wherein said organic molecules have the formula:

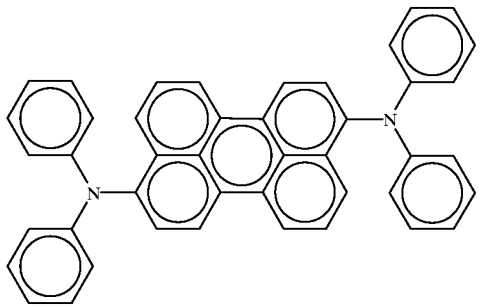

16. An organic electroluminescent display device as in claim 9, wherein said organic molecules have the formula:

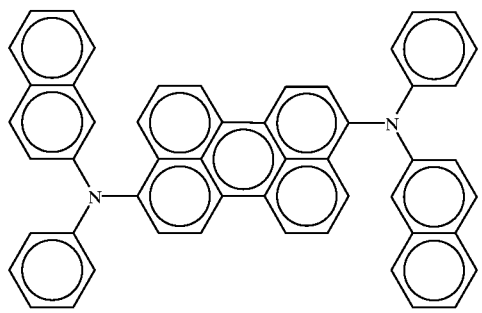

17. An organic electroluminescent display device comprising a plurality of layers of organic molecules disposed between a pair of electrodes, at least one of said layers containing $10^{-3}$ to 10 mole percent of organic molecules having the general formula:

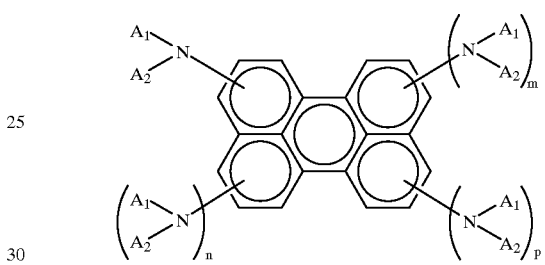

where n, m, and p each independently equal 0, 1, or 2; and A1 and A2 are selected from the group consisting of an alkyl group, an alkyl group substituted with aryl, hydroxy, cyano, alkoxy, halo, aryl groups, and an aryl group substituted with alkyl, aryl, hydroxy, cyano, alkoxy, phenyl, halo, amino groups.

18. An organic electroluminescent display device as in claim 17, wherein said organic molecules have the formula:

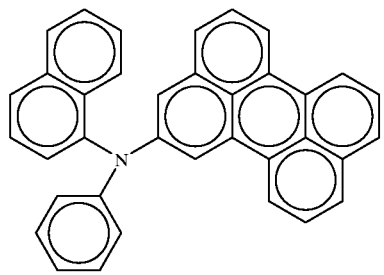

19. An organic electroluminescent display device as in claim 17, wherein said organic molecules have the formula:

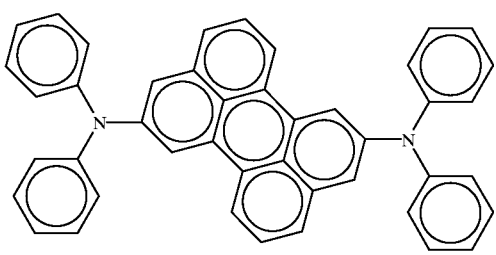

20. An organic electroluminescent display device as in claim 17, wherein said organic molecules have the formula:

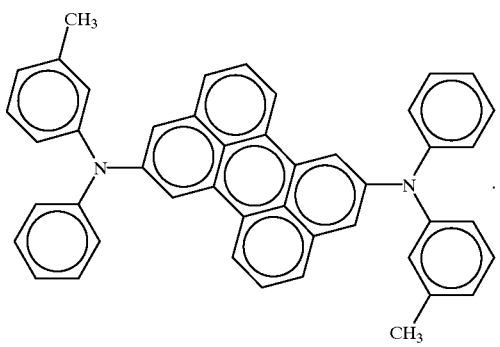

21. An organic electroluminescent display device as in claim 17, wherein said organic molecules have the formula:

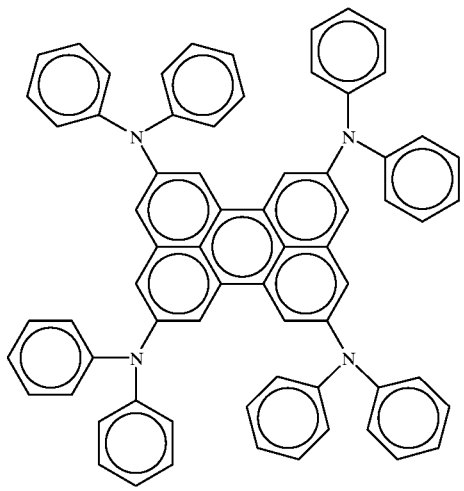

22. An organic electroluminescent display device as in claim 17, wherein said organic molecules have the formula:

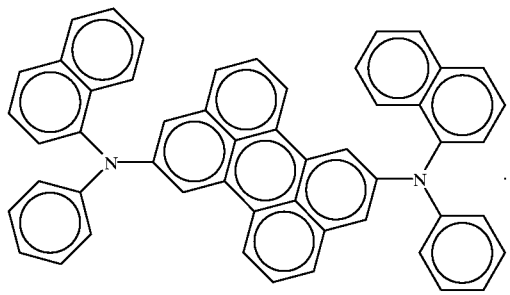

23. An organic electroluminescent display device as in claim 17, wherein said organic molecules have the formula:

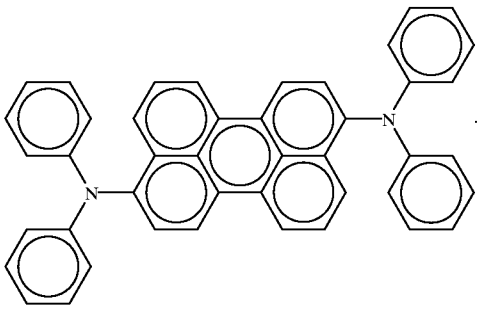

24. An organic electroluminescent display device as in claim 17, wherein said organic molecules have the formula:

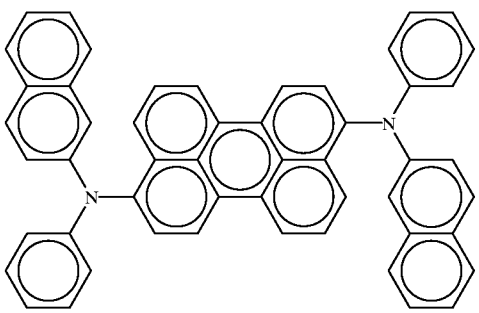

* * * * *